(12) United States Patent
Ishida

(10) Patent No.: US 6,224,670 B1
(45) Date of Patent: May 1, 2001

(54) CUP-TYPE PLATING METHOD AND CLEANING APPARATUS USED THEREFOR

(75) Inventor: Hirofumi Ishida, Kanagawa (JP)

(73) Assignee: Electroplating Engineers of Japan Limited, Kanagawa (JP)

( * ) Notice: Subject to any disclaimer, the term of this patent is extended or adjusted under 35 U.S.C. 154(b) by 0 days.

(21) Appl. No.: 09/204,729

(22) Filed: Dec. 3, 1998

(30) Foreign Application Priority Data

Apr. 3, 1998 (JP) .................................................. 10-091836

(51) Int. Cl.$^7$ .................................................. B05C 13/02
(52) U.S. Cl. .................................. 118/70; 118/429; 901/41
(58) Field of Search .......................... 15/246.5, 77, 102, 15/302; 118/70, 429; 901/29, 43, 41

(56) References Cited

U.S. PATENT DOCUMENTS

| | | | |
|---|---|---|---|
| 4,300,198 | * | 11/1981 | Davine . |
| 4,367,532 | * | 1/1983 | Crum et al. . |
| 4,416,577 | * | 11/1983 | Inatoa et al. . |
| 4,635,328 | * | 1/1987 | Palmer . |
| 4,693,664 | * | 9/1987 | Schweiker . |
| 4,781,519 | * | 11/1988 | Monforte . |
| 5,044,063 | * | 9/1991 | Voellmir . |
| 5,098,024 | * | 3/1992 | MacIntyre et al. . |
| 5,377,913 | * | 1/1995 | Van Der Woude . |

\* cited by examiner

*Primary Examiner*—Brenda A. Lamb
(74) *Attorney, Agent, or Firm*—Kenneth Watov; Watov & Kipnes, P.C.

(57) ABSTRACT

It is an object of the present invention to provide a technology capable of plating satisfactorily even when wafers with a seed metal is plated in sequence by utilizing a cup-type plating apparatus. Plating solution adhered on a support 2 is removed between an initial and a subsequent plating processes by a cleaning apparatus 5 for a support 2 on a cup-type plating tank. The cleaning apparatus 5 comprises a first arm 9 of which distal end is positionable at the center of an upper portion of an opening of a plating tank 1, and a second aim 12 which is mounted at one end thereof to the distal end of the first arm 9, is provided at the other end thereof with a cleaner 11 and is pivotal about the distal end of the first arm 9.

2 Claims, 4 Drawing Sheets

CUP-TYPE PLATING METHOD AND CLEANING APPARATUS USED THEREFOR

BACKGROUND OF THE INVENTION

1. Field of the Invention

The present invention relates to a plating method in which a cup-type plating apparatus is used for plating semiconductor wafers.

2. Earlier Technologies

Cup-type plating methods have been known as a method for conducting bump plating on semiconductor wafers (see Japanese Utility Model Application Laid-open No. 122067/1991 and Japanese Patent Application Laid-open No. 320978/1994). In the cup-type plating methods, a plating process is conducted by the steps including: placing a wafer on a support provided along an upper portion of an opening of a plating tank; supplying plating solution by flowing the solution upward through a bottom of the plating tank; and bringing the plating solution into contact with a surface to be plated of the wafer. The cup-type plating methods can provide identical plating continuously by replacing wafers being placed on the support, thus have been widely used as suitable methods for automation of plating processes and small lot production.

However in the cup-type plating methods, replacement of wafers on each occasion of plating process often causes adhesion of plating solution, after a plated wafer is detached, on the support on which the wafer was placed. On this condition, when another or new wafer is placed, the periphery of the wafer will inevitably come in contact with the plating solution adhered on the support.

Such a phenomenon has been a mal-factor that inhibits satisfactory plating in the cup-type plating methods. Especially, when wafers with seed metal, that is wafers which are preliminarily covered at a surface to be plated thereof with metal such as Cu are plated, the plating solution adhered on the support causes conditions not preferable to a plating process. Specifically speaking, after a wafer with seed metals is replaced with another but before placed on the support to be supplied with plating current, the plating solution adhered on the support will dissolve the seed metal at the periphery of the wafer placed. The wafer with seed metal supplies a surface to be plated with plating current via the seed metal, and if the seed metal on the periphery of the wafer is dissolved, plating current may not be uniformly supplied.

SUMMARY OF THE INVENTION

It is an object of the present invention to provide a technology capable of plating satisfactorily even when wafers with a seed metal is plated in sequence by utilizing a cup-type plating apparatus. For solving the problem occurring about a cup-type plating method comprising the step of placing a wafer on a support provided along an upper portion of an opening of a plating tank, for subjecting the wafer to plating, the present invention adopts a cleaning means movable along the support and capable of removing plating solution adhered on the support between an initial and a subsequent plating processes. According to the invention, since the plating solution adhered on the support of the plating tank will have been removed between an initial and a subsequent plating processes, more particularly between that a plated wafer is removed and that next new wafer is placed on the support, even if wafers with seed metal are replaced in sequence on the support, the seed metal on the periphery of a wafer in contact with the support will not dissolve. As a result, plating current can be uniformly supplied, and thereby good or satisfactory plating can be provided. Further, even when the plating solution to be used is very corrosive, the period of time during which the plating solution adheres and corrodes the support will be shortened, so that the support can be prevented from being corroded soon.

In the present invention, the cleaning means for removing the plating solution adhered on the support is preferably formed by either an absorber capable of absorbing plating solution or a suction device capable of sucking plating solution. Such methods of removing the plating solution adhered on the support can include washing with wash water which, however, will be inconvenient because it is assumed that wash water will enter the plating tank to change the concentration of the plating solution. The cleaning means of the present invention can advantageously remove the plating solution adhered on the support without affecting, for instance the concentration of the plating solution, so that the cleaning means will be more suitable when wafers should be sequentially plated. Further, when a cup-type plating apparatus is installed in a clean room, it is especially preferable to use such a cleaning means because it will affect less, for instance the environment in the clean room.

As an absorber being used for the above-described cleaning means, any materials are qualified if they can absorb plating solution. For example, sponge or fabric resistant to corrosion with respect to plating solution is preferable. The suction device can be a sucking section which is connected to a suction pump. With the suction device, the sucking section operated to move in contact with the support can remove adhered plating solution.

For carrying out the above-described cup-type plating method according to the present invention, a cleaning apparatus for cleaning a support provided along an upper portion of an opening of a plating tank should include a first arm of which distal end is positionable at the center of the upper portion of the opening of the plating tank, and a second arm which is mounted at one end thereof to the distal end of the first arm and provided at the other end thereof with a cleaning means, and is pivotal about the distal end of the first arm. The cup-type plating method according to the present invention is directed to removing plating solution adhered on the support between an initial and a subsequent plating processes, namely a period of time after a wafer plated is removed from the support but before a next new wafer is placed on the support. Considering replacement of wafers, the arm and cleaning means must be kept apart from a space above the opening of the plating tank other than when plating solution adhered on the support is being removed. Therefore, the cleaning apparatus for the support on the plating tank according to the present invention is constructed to allow the first arm to pivot to move onto the opening of the plating tank for removing plating solution adhered on the support, and allow the first arm to pivot again to move away from the opening of the plating tank after the support is cleaned. The cleaning apparatus according to the present invention having a simple structure may be mounted directly to a cup-type plating tank, or be mounted separately in the vicinity of the tank.

The present invention is not limited to the above embodiments and its other objects, features, and advantages will be apparent from the following detailed description in conjunction with the relevant drawings. It is also understood that various changes and modifications not departing from the spirit of the prevent invention will be covered by the scope of the present invention.

PREFERRED EMBODIMENT

Figure 1:
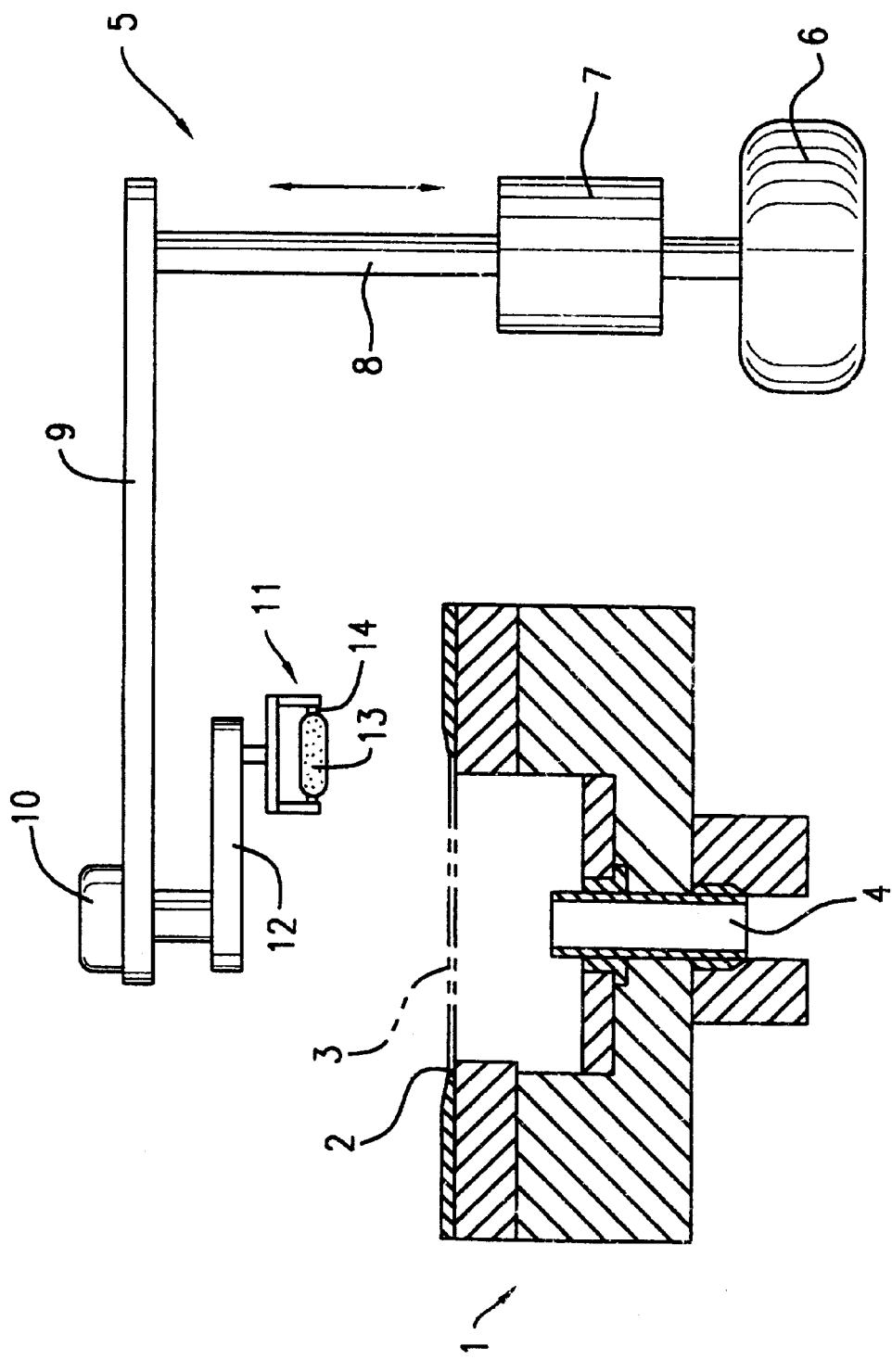
FIG. 1 is a schematic cross section of a cup-type plating apparatus and a cleaning apparatus for a cup-type plating tank according to an embodiment of the present invention.
Figure 2:
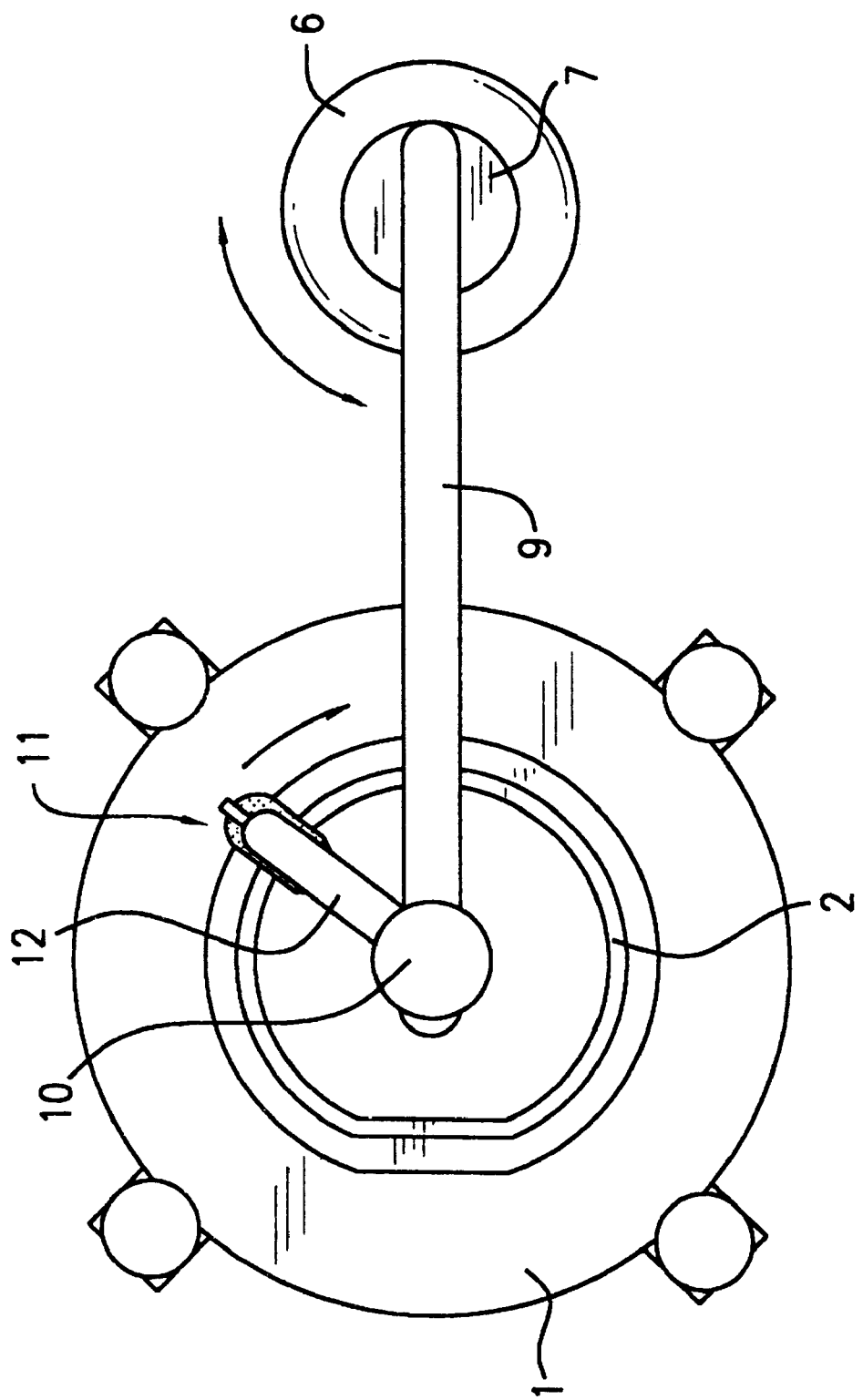
FIG. 2 is a schematic plan view of a cup-type plating apparatus and a cleaning apparatus for a cup-type plating tank according to an embodiment of the present invention.

A preferred embodiment of the present invention will be described referring to the accompanying drawings. FIG. 1 illustrates a schematic cross section of a cup-type plating apparatus and a cleaning apparatus for a cup-type plating tank according to an embodiment of the present invention, and FIG. 2 illustrates a schematic plan view of FIG. 1 when viewed from the above. As FIG. 1 shows, in the cup-type plating method, a plating process is conducted by the steps including: placing a wafer 3 on a support 2 provided along an upper portion of an opening of a plating tank 1; supplying plating solution by flowing the solution upward via a plating solution supply section 4 provided at a lower part of the plating tank 1; and making the plating solution into contact with a surface to be plated of the wafer 3.

When plating of the wafer 3 placed is completed, plating current and supply of plating solution are stopped, the plated wafer 3 is detached from the support 2 by using a wafer holder, not shown, which can adsorb and support the wafer 3, and another wafer 3 to be plated next is also placed on the support 2, thus plating of wafers are conducted in sequence.

During replacement of the wafers 3, plating solution adhered to the support 2 of the plating tank 1 is removed from a cleaning apparatus 5. The cleaning apparatus 5 is connected to a rotary actuator 6, and is formed by a strut 8 which is vertically retractable by an air cylinder 7; a first arm 9 mounted to an upper end of the strut 8; and a second arm 12 which is connected to a pivotal motor 10 mounted to a distal end of the first arm 9 and is provided at a distal end thereof with a cleaner 11. The first arm 9 is adapted to have a length that the distal end thereof is positionable at the center of the upper portion of the opening of the plating tank 1 when the arm 9 is pivoted about the strut 8 via the rotary actuator 6. The second arm 12 is adapted to have a length that the cleaner 11 provided at the distal end of the second arm 12 is moveable along the support 2 when the distal end of the first arm 9 is moved to the center of the upper portion of the opening of the plating tank 1 (see FIG. 2).

The cleaner 11 is an absorptive sponge 13 which absorbs plating solution easily and is corrosion-resistant. The cleaner 11 is cylindrically formed and is mounted on a rotary shaft 14 so that a cylindrical side of the absorptive sponge 13 which contacts with the support 2 when moving along the support 2 can rotate.

A removing operation of plating solution utilizing the cleaning apparatus 5 is now described specifically. Until an operation that a wafer 3 plated is detached is completed, that is while a wafer is on the support 2, the first arm 9, second arm 12 and the cleaner 11 are in a respective initial position, namely a rest position spaced apart from a space above the plating tank 1. When the plated wafer 3 on the support 2 is detached from the support 2 by using the not-shown wafer holder, the rotary actuator 6 pivots the first arm 9 to position the distal end of the first arm 9 to the center of the upper portion of the opening of the plating tank 1.

Subsequently to the above operation, the strut 8 is retracted downward by the air cylinder 7 to allow the absorptive sponge 13 of the cleaner 11 to be slightly pressed into contact with the support 2. While the absorptive sponge 13 is maintained pressed into contact with the support 2, the pivotal motor 10 pivots the second arm 12 to move the cleaner 11 along the support 2, thereby allowing the absorptive sponge 13 to remove plating solution adhered on the support 2.

After the second arm 12 is rotated a few times to remove the plating solution adhered on the support 2 completely, a set of operations including stopping the rotation of the second arm 12, extending the strut 8 upward by using the air cylinder 7 to move the cleaner 11 away from the support 2 and pivoting the first arm 9 by using the rotary actuator 6 to allow the first arm 9, second arm 12 and the cleaner 11 to return to a respective initial position apart from the space above the plating tank 1. Then, another new wafer 3 is placed on the support 2 from which plating solution has been removed, and a next plating operation is initiated.

Figure 3:
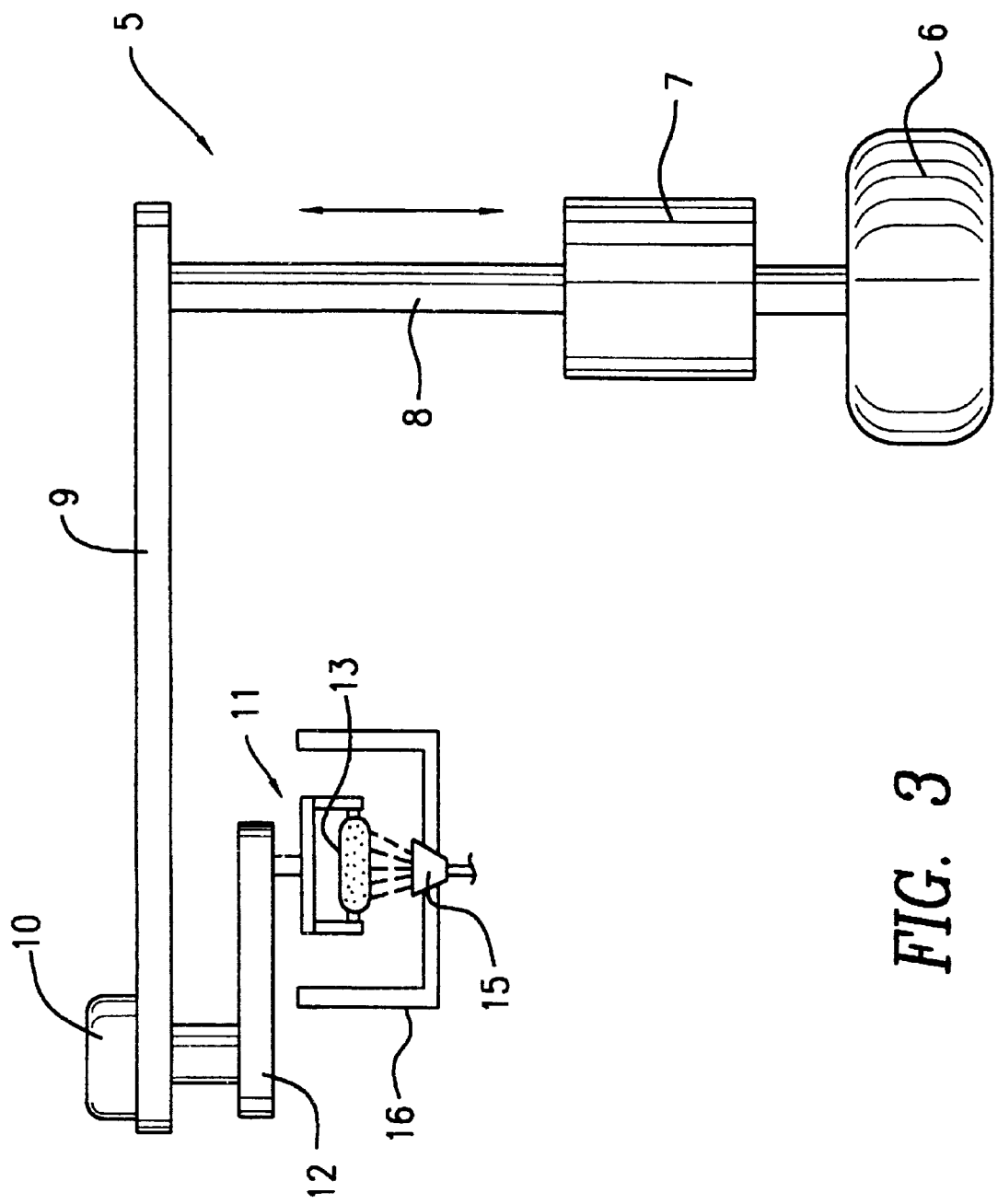
FIG. 3 is a schematic cross section which shows the cleaning means is located in a cleaner-cleaning chamber.

As FIG. 3 shows, a cleaner-cleaning chamber 16 with a cleaner shower 15 capable of spraying cleaning water is separately provided for cleaning the absorptive sponge 13 when the cleaning apparatus 5 is in the initial position. After the plating solution adhered on the support 2 is completely removed, by cleaning the absorptive sponge 13 in the cleaner-cleaning chamber 16, the plating solution adhered on the support 2 will be again completely removed.

Figure 4:
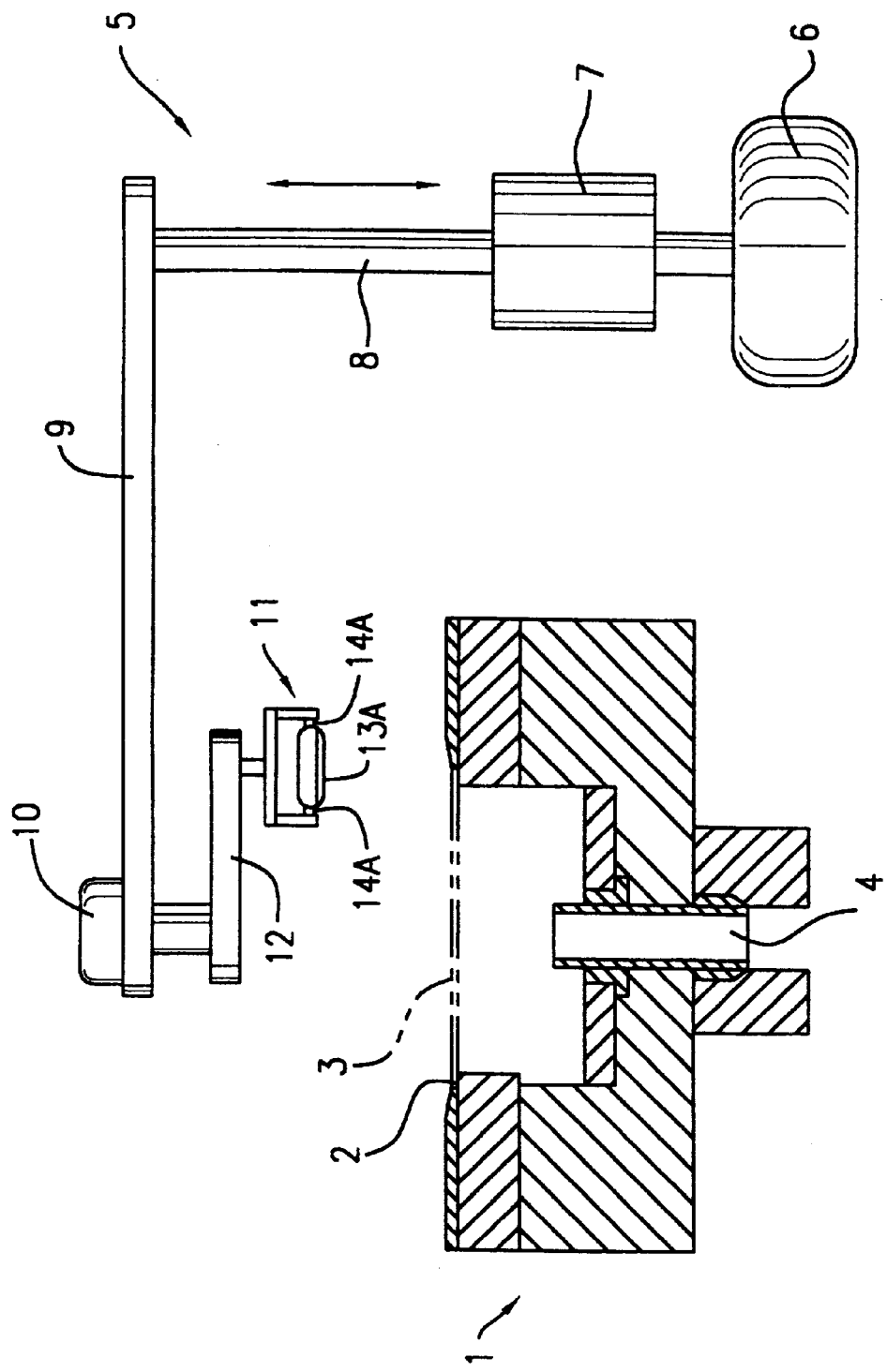
FIG. 4 is a schematic cross section showing the cleaning means for another embodiment of the invention.

In another embodiment, as previously mentioned in the "Summary of The Invention", the cleaning means 11 can be formed by a suction device 13A, as shown in FIG. 4. As shown, the suction device 13A is supported by support members 14A, and is connected by appropriate means to a suction pump (not shown). In operation, instead of removing plating solution adhered on the support 2 by using an absorptive sponge 13, as previously described, the sponge 13 is replaced by a suction device 13A to suck up the plating solution from support 2.

What is claimed is:

1. A plating apparatus comprised of a cup shaped plating tank for containing a plating solution applied to a semiconductor wafer during a plating operation and a support for supporting the semiconductor wafer, said support provided on an opening of said plating tank, a cleaning apparatus comprising:

a first arm having a distal end positionable at a center of an upper portion of the opening of said plating tank; and a second arm mounted at an end thereof to the distal end of said first arm, said second arm being provided at its other end with a cleaning device, and further being rotatable about the distal end of said first arm;

said cleaning apparatus being operable between successive plating operations, for removing the plating solution adhered to said support after a plating operation, via rotation of said second arm to move said cleaning device around and against said support to remove the plating solution therefrom by transfer to said cleaning device, thereby providing a clean support for the next plating operation.

2. A cleaning apparatus for a support of a cup-type plating tank according to claim 1 wherein cleaning means is formed by either an absorber capable of absorbing the plating solution or a suction device capable of sucking the plating solution.

* * * * *